United States Patent [19]
Bernstein et al.

[11] Patent Number: 6,097,207
[45] Date of Patent: Aug. 1, 2000

[54] ROBUST DOMINO CIRCUIT DESIGN FOR HIGH STRESS CONDITIONS

[75] Inventors: Kerry Bernstein; Norman J. Rohrer, both of Underhill; Jeffrey S. Zimmerman, Hinesburg, all of Vt.

[73] Assignee: International Business Machines Corporation, Armonk, N.Y.

[21] Appl. No.: 09/138,100

[22] Filed: Aug. 21, 1998

[51] Int. Cl.[7] .............................................. H03K 19/003
[52] U.S. Cl. .................................. 326/9; 326/95; 326/98
[58] Field of Search .................................. 326/93, 95, 98, 326/49, 50, 14, 15, 16, 9

[56] References Cited

U.S. PATENT DOCUMENTS 4,656,417   4/1987   Kirkpatrick et al. .
5,059,828  10/1991   Tanagawa .
5,572,151  11/1996   Hanawa et al. .
6,002,292  11/1999   Allen et al. ............................... 327/379

Primary Examiner—Michael Tokar
Assistant Examiner—Anh Tran
Attorney, Agent, or Firm—Schmeiser, Olsen & Watts; Eugene I. Shkurko

[57] ABSTRACT

A domino circuit design for handling high stress conditions. The domino logic circuit includes a programmable mechanism for choosing whether the circuit is operating during normal operations or during a stress test, such as a burn-in procedure. In particular, the circuit includes a dual purpose transistor that is controllable by either a precharge signal or an output signal, and includes a mechanism for selecting whether the precharge signal or the output signal is to control the gate input of the dual purpose transistor. Accordingly, the dual purpose transistor will either act in parallel with the precharge device, or a keeper device depending on the mode of operation chosen.

13 Claims, 2 Drawing Sheets

ROBUST DOMINO CIRCUIT DESIGN FOR HIGH STRESS CONDITIONS

BACKGROUND OF THE INVENTION

1. Technical Field

The present invention relates to logic circuits, and more particularly relates to a domino circuit design for handling high stress conditions.

2. Related Art

Domino logic circuit design techniques have become widely used for applications requiring high performance. Such designs offer significant speed advantages over logic circuits employing more traditional designs, such as those that utilize pass gate or static logic designs. In particular, because domino logic circuits employ a "precharge" state, they can be switched much quicker than a comparable static logic circuit.

FIG. 1 illustrates a typical domino gate circuit 10, in this case a pseudo two-way AND logic gate. The circuit includes a PFET 16 that acts as a precharge device, a PFET 18 that acts as a keeper device, an inverter buffer 20, an output 24, a precharge input PC, an NFET 26 that is referred to as foot switch, a pair of NFETs 12 and 14 that comprise evaluate inputs A and B, and precharge node Node E. The circuit operates in two phases, the precharge phase and the evaluate phase. During the precharge phase, PC is low therefore causing precharge device 16 to charge Node E to Vdd. Accordingly, inverter buffer 20 causes the output 24 to go low and keeper device 18 to turn on causing Node E to be maintained or "kept" at Vdd. During the evaluate phase, PC goes high and the foot device 26 turns on which allows for the evaluation of inputs A and B. Thus, if A and B are both high, Node E is discharged to ground, and output 24 goes high. Alternatively, if A and/or B were low, Node E would remain at high due to the capacitance existing at node E. Keeper device 18 prevents Node E from drooping during the evaluation due to various leakage mechanisms. The keeper device 18 is generally a weak device, presenting very little hysteresis (or delay) during times when inputs A and B go high to pull down Node E. Keeper device 18 also guards against noise on Node E, but because of its size, it is insufficient to provide substantial noise immunity.

Once the evaluation is complete and PC is again active, it is desirable to quickly recharge Node E to Vdd. Therefore, precharge device 16 must be of sufficient size to meet this requirement. Accordingly, for high performance logic paths, precharge device 16 is necessarily much larger than keeper device 18. For example, if precharge device 16 were to have a width to length ratio of 1/1, keeper device would likely have a width to length ratio of 1/3.

As noted, keeper device 18 has two important functions, namely to maintain the charge at Node E by replacing charge loss to leakage, and to provide noise immunity. By minimizing the relative size of keeper device 18, Node E becomes easier to discharge during a logic function evaluation, therefore resulting in higher speed and performance. In other words, as the relative size of the keeper device 18 is increased, increased hysteresis is introduced onto Node E therefore resulting in decreased performance. As such, it is desirable to keep the keeper device 18 relatively small so that Node E can maintain its charge and operate as quickly as possible. However, the size of the keeper device must be large enough to replace leakage charge. If device 18 is sized large to contribute significant noise immunity, the performance suffers substantially. Thus, depending on the level of noise immunity required, a significant performance limitation may be introduced.

As with many of today's more advanced and critical integrated circuit devices, it is necessary to perform extensive reliability testing on chips containing domino circuits as part of the quality assurance procedure. Such tests seek to stress the integrated circuit device beyond its normal operating range to expose defects. During one such test, referred to as "burn-in," the chip is run at an elevated voltage and temperature. Accordingly, domino circuits, such as the one depicted in FIG. 1, must be designed with increased functionality margin. In particular, because Vdd will be set at an elevated level, noise effects on Node E or increased sub-threshold leakage effects on Node E can result in a potential failure, particularly if keeper device 18 is small. As such, during burn-in, as opposed to normal operations it is desirable for keeper device 18 to be relatively large. Because high performance is not needed during burn-in (the device under stress is operated at a much reduced frequency) the operation of precharge device 16 becomes far less critical so size is not as important.

At elevated voltages, the risk of failure of a domino circuit is greater because incident noise is substantially worse. Referring still to FIG. 1, consider the case where input A is low and B is high during the evaluate phase. Node E should remain at or near Vdd which would result in an output 24 value of low. However, capacitive coupling on the input A is larger during burn-in and can potentially erode the Node E precharge. Thus, during burn-in there may be sufficient noise present to pull Node E low and erroneously flip the output. Thus, a need exists to provide a domino circuit that can protect against failures during burn-in while providing high performance during normal functionality.

SUMMARY OF THE INVENTION

The present invention overcomes the above-mentioned problems in the prior art by providing a domino logic circuit that comprises a dual purpose transistor coupled to the precharge node and having a gate input controllable by either a precharge signal or an output signal; and a mechanism for selecting either the precharge signal or the output signal to control the gate input of the dual purpose transistor. Accordingly, during normal operations, the dual purpose transistor operates in conjunction with the precharge device to provide a relatively large precharge device and small keeper device to thereby provide high performance. Alternatively, during stress tests and the like, the dual purpose transistor acts in concert with the keeper device to provide a relatively large keeper device and small precharge device, thereby providing a mechanism that can protect against leakage and noise. This is done in such a way as to add no additional precharge capacitance or performance penalty.

The mechanism for selecting the role of the dual purpose transistor may be controlled by an external signal, such as with a JTAG (joint test action group) signal line.

The foregoing and other objects, features and advantages of the invention will be more apparent from the following and more particular description of the preferred embodiments of the invention as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

DETAILED DESCRIPTION OF THE PREFERRED EMBODIMENT

Figure 1:
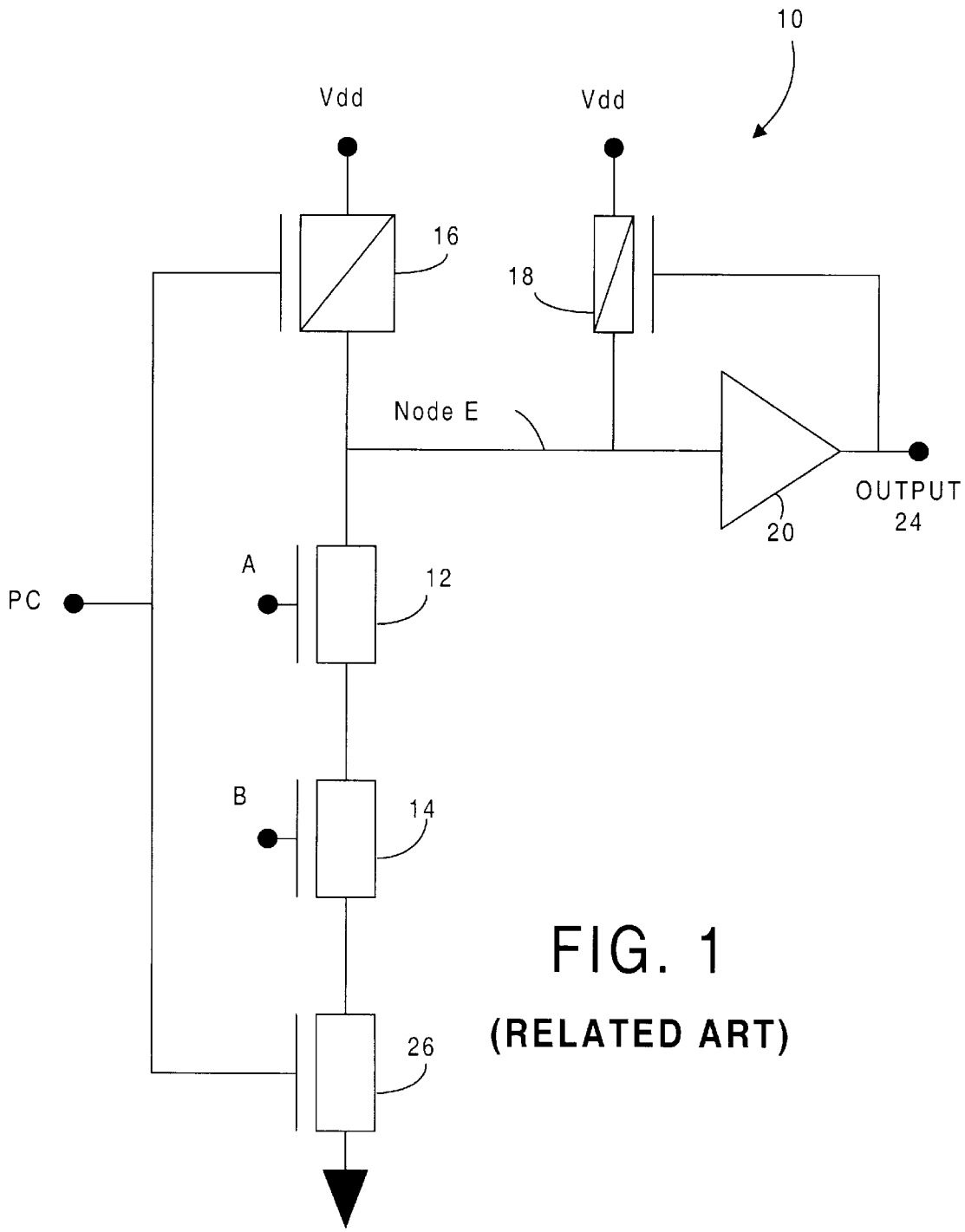
FIG. 1 depicts a domino logic circuit designed in accordance with known techniques.
Figure 2:
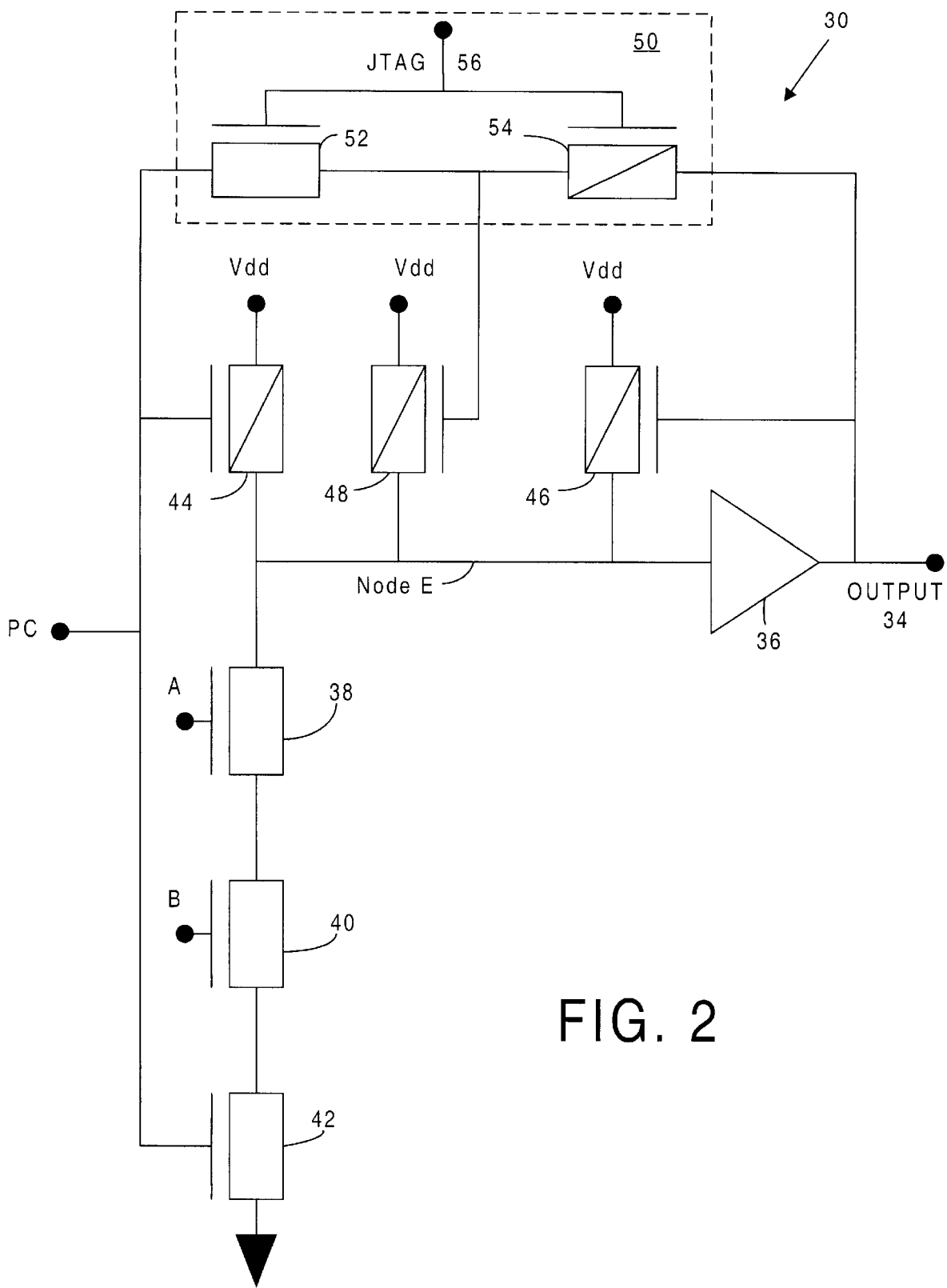
FIG. 2 depicts a programmable domino logic circuit designed in accordance with a preferred embodiment of the present invention.

Referring now to FIG. 2, an improved programmable domino logic circuit 30 is depicted. Similar to the domino logic circuit depicted in FIG. 1, the improved circuit 30 comprises a precharge input PC, an output signal 34, an inverter buffer 36, NFET pair 38 and 40 for receiving logic inputs A and B, NFET 42 to act as a foot switch, precharge device 44, keeper device 46, and precharge node Node E. In addition, the improved circuit 30 comprises a dual purpose transistor PFET 48 and a selection mechanism 50 made up of NFET 52, PFET 54, and JTAG input 56.

For the embodiment shown in FIG. 2, the traditional precharge device (such as device 16 of FIG. 1) has essentially been split into two devices, a precharge transistor 44 and a dual purpose transistor 48. During normal operations, dual purpose transistor 48 is programmed to work together with precharge transistor 44 to provide a relatively large precharge system relative to keeper device 46. Conversely, during burn-in, dual purpose transistor 48 is programmed to work together with keeper device 46 to provide a relatively large keeper system relative to precharge transistor 44. Accordingly, the dual purpose transistor 48 can be programmed to either work as a restore device during normal use or a holding device during burn-in.

The mode of operation of the dual purpose transistor 48 is controlled by the JTAG signal line 56, which is low during burn-in and high during normal operations. The JTAG signal line 56 controls devices 52 and 54 which cause dual purpose transistor 48 to act in parallel with either precharge transistor 44 or keeper device 46. During normal operations, the JTAG signal is set high causing NFET 52 to turn on and PFET 54 to turn off, thereby forcing the gate of the dual purpose transistor 48 to become controlled by the PC input. Thus, transistors 44 and 48 will act as a single larger transistor or precharge system during normal operations. NFET 52 may comprise a low threshold voltage (Vt) NFET to provide as much overdrive as possible to the dual purpose transistor 48 during normal operation, when performance is crucial.

During burn-in operations and the like, the JTAG signal is set low causing PFET 54 to turn on and NFET 52 to turn off, thereby forcing the gate of the dual purpose transistor 48 to become controlled by the output 34. Thus, when the JTAG signal 56 is low, transistors 46 and 48 will act as a single large transistor or keeper device during burn-in.

The relative size of the dual purpose transistor is chosen to provide sufficient noise immunity during burn-in by increasing the hysteresis of the output signal 34, but still small enough to allow the Node E to be pulled to a valid logic low by NFET pair 38 and 40. In the preferred embodiment, the keeper device 46 may be maintained at its pre-existing size, as shown in FIG. 1, while the precharge device 44 may be partitioned such that approximately twenty percent (20%) of the device's width is transferred to the dual purpose device 48.

Very little performance is compromised for the added burn-in margin. With this design, no additional capacitance is added to Node E. The only additional junction capacitance, which is the source of device 54, is added to the output load capacitance. In addition, there is only an insignificant delay due to the source follower action of device 52 on the overdrive provided to the dual purpose device 48 during precharge.

The foregoing description of the preferred embodiments of the invention have been presented for purposes of illustration and description. They are not intended to be exhaustive or to limit the invention to the precise formed disclosed, and obviously many modifications and variations are possible in light of the above teachings. For example, this technique can be implemented within any type of logic circuit having both a precharge and evaluate phase. Moreover, while the preferred embodiment suggests using a JTAG signal line to switch modes, any type of signal, whether initiated by software or hardware could be utilized. Accordingly, such modifications and variations that may be apparent to a person skilled in the art are intended to be included within the scope of this invention as defined by the accompanying claims.

What is claimed is:

1. A domino logic circuit, comprising:
   a dual purpose transistor coupled to a precharge node and having a gate input controllable by either a precharge signal or an output signal; and
   a mechanism for selecting either the precharge signal or the output signal to control the gate input.

2. The domino logic circuit of claim 1, wherein the selecting mechanism comprises a PFET and an NFET transistor.

3. The domino logic circuit of claim 2, wherein the PFET and NFET transistors have a gate input controlled by an external control signal.

4. The domino logic circuit of claim 1, further comprising:
   a precharge transistor coupled to the precharge node and controllable by the precharge signal;
   a keeper transistor coupled to the precharge node and controllable by the output signal; and
   wherein the select mechanism causes the dual purpose transistor to either operate in parallel with the precharge transistor or with the keeper transistor.

5. The domino logic circuit of claim 4, wherein the parallel configuration of the dual purpose transistor with the precharge transistor causes the domino circuit to be configured for normal operations.

6. The domino logic circuit of claim 4, wherein the parallel configuration of the dual purpose transistor with the keeper transistor causes the domino circuit to be configured for burn-in operations.

7. A domino circuit, comprising:
   a precharge node;
   a precharge device for charging the precharge node, said precharge device controlled by a precharge signal;
   a keeper device for charging the precharge node, said keeper device controlled by an output signal; and
   a dual purpose device for charging the precharge node, said dual purpose device controllable by either the precharge signal or the output signal.

8. The domino circuit of claim 7, further comprising:
   a selection mechanism for selecting either the precharge signal or output signal to control the dual purpose device.

9. The domino circuit of claim 8, wherein the selection mechanism causes the dual purpose transistor to operate in parallel with either the precharge device or the keeper device.

10. The domino circuit of claim 9, wherein the dual purpose device is a FET having a gate input coupled to said selection mechanism.

11. The domino circuit of claim 10, wherein the selection mechanism includes an NFET and a PFET, each having a gate input controlled by a control signal.

12. The domino circuit of claim 11, wherein the control signal comprises a JTAG signal.

13. A circuit having a precharge node, comprising:

precharge means for charging said precharge node during a precharge phase;

keeper means for maintaining said charge on said precharge node during an evaluate phase;

dual purpose charging means for acting in parallel with either the precharge means or keeper means to provide additional charge to the precharge node; and switching means for causing said dual purpose charging means to act with either the precharge means or keeper means.

* * * * *